United States Patent
Chen

(10) Patent No.: US 7,923,852 B2
(45) Date of Patent: Apr. 12, 2011

(54) SEMICONDUCTOR PACKAGE STRUCTURE WITH PROTECTION BAR

(75) Inventor: Jen-Chung Chen, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 225 days.

(21) Appl. No.: 12/364,525

(22) Filed: Feb. 3, 2009

(65) Prior Publication Data

US 2010/0171212 A1    Jul. 8, 2010

(30) Foreign Application Priority Data

Jan. 5, 2009 (TW) ................. 98100097 A

(51) Int. Cl.
*H01L 23/48* (2006.01)
*H01L 23/52* (2006.01)
(52) U.S. Cl. ............... 257/787; 257/780; 257/E23.069
(58) Field of Classification Search .......... 257/787, 257/780, E23.181
See application file for complete search history.

(56) References Cited

U.S. PATENT DOCUMENTS

| 5,834,848 | A | * | 11/1998 | Iwasaki | 257/778 |
|---|---|---|---|---|---|
| 5,889,333 | A | * | 3/1999 | Takenaka et al. | 257/783 |
| 5,914,531 | A | * | 6/1999 | Tsunoda et al. | 257/668 |
| 6,287,895 | B1 | | 9/2001 | Sato | |
| 6,291,899 | B1 | * | 9/2001 | Wensel et al. | 257/787 |
| 6,906,425 | B2 | | 6/2005 | Stewart et al. | |
| 7,459,797 | B2 | * | 12/2008 | James et al. | 257/787 |
| 7,485,971 | B2 | * | 2/2009 | Fuller et al. | 257/780 |
| 7,728,440 | B2 | * | 6/2010 | Honda | 257/778 |
| 2002/0027298 | A1 | * | 3/2002 | Sakamoto et al. | 257/787 |
| 2002/0121705 | A1 | * | 9/2002 | Pu et al. | 257/778 |
| 2002/0140108 | A1 | * | 10/2002 | Johnson | 257/778 |
| 2002/0195704 | A1 | | 12/2002 | Chan | |
| 2006/0060636 | A1 | | 3/2006 | Daves | |

* cited by examiner

*Primary Examiner* — Nitin Parekh
(74) *Attorney, Agent, or Firm* — Winston Hsu; Scott Margo

(57) ABSTRACT

A semiconductor package structure includes a carrier, a chip or multi-chips mounted on a top surface of the carrier, a molding compound encapsulating the top surface and the chips, a plurality of solder balls distributed on a bottom surface of the carrier, and a protection bar formed of thermosetting plastic material formed on the bottom surface.

3 Claims, 5 Drawing Sheets

SEMICONDUCTOR PACKAGE STRUCTURE WITH PROTECTION BAR

BACKGROUND OF THE INVENTION

1. Field of the Invention

The present invention relates to a semiconductor package structure. More particularly, the present invention relates to a semiconductor package structure with a protection bar that can prevent package warpage.

2. Description of the Prior Art

There are continuing efforts to improve the reliability of the plastic package technology for encapsulating semiconductor devices. A main cause for the lack of reliability in the plastic packages has been that materials having different physical characteristics are in contact with each other. For example, differences in coefficient of thermal expansion among a molding compound which forms the package body, a semiconductor chip which is made of silicon, and solder balls consisting of tin alloy, can cause separation of the materials during subsequent reliability testing. The aforesaid reliability testing is typically used to assess thermal stress and strain concentration on the solder joints between the chip and the chip carrier, which may cause potential fatigue failure of the system.

FIG. 1 is a schematic degree-of-warpage vs. temperature graph during a thermal cycle implemented in a conventional reliability testing process for a chip package. As shown in FIG. 1, the mismatch of the coefficient of thermal expansion between the chip carrier and the molding compound leads to different warping effects on the package during the thermal cycle. After cooling to a relatively low-temperature zone, the package bows and the side view of the package is analogous to a convex curve (crying curve). The contraction difference produces compressive stress on the solder joints. In a relatively high-temperature zone, the package warps and the side view of the package is analogous to a smiling curve. Therefore, in a relatively high-temperature zone, the solder joints are subjected to tensile stress. When the solder joints are twitched due to compressive stress and tensile stress repeatedly concentrated thereto, the solder joints may not tightly bonded to the bond pads on a printed circuit board (PCB), causing failure of electrical connection between the package and the PCB.

In light of the above, there is a strong need in this industry to provide an effective solution to solve the aforesaid package warping occurred during the thermal cycle implemented in a reliability testing process for a chip package, thereby effectively avoiding damage to the electrical connection between the package and the PCB and improving reliability.

SUMMARY OF THE INVENTION

It is one objective of this invention to provide an improved semiconductor package structure in order to solve the prior art problem of insufficient reliability of electrical connection between the package and the printed circuit board.

According to one preferred embodiment of this invention, there is provided a semiconductor package structure including a carrier substrate; an integrated circuit die mounted on a top surface of the carrier substrate; a molding compound covering and encapsulating the top surface and the integrated circuit die; a plurality of solder balls mounted on a bottom surface of the carrier substrate; an at least one protection bar disposed on the bottom surface of the carrier substrate, wherein the protection bar is made of thermosetting polymeric material.

According to another preferred embodiment of this invention, there is provided a memory module structure including a printed circuit board; a plurality of memory chip packages mounted on the printed circuit board; a heat sink lid covering each of the memory chip packages, the heat sink lid thermally contacting with each of the memory chip packages through a heat-dissipating glue, wherein each of the memory chip packages comprises: a carrier substrate; an integrated circuit die mounted on a top surface of the carrier substrate; a molding compound covering and encapsulating the top surface and the integrated circuit die; a plurality of solder balls mounted on a bottom surface of the carrier substrate; and at least one protection bar disposed on the bottom surface of the carrier substrate, wherein the protection bar is made of thermosetting polymeric material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
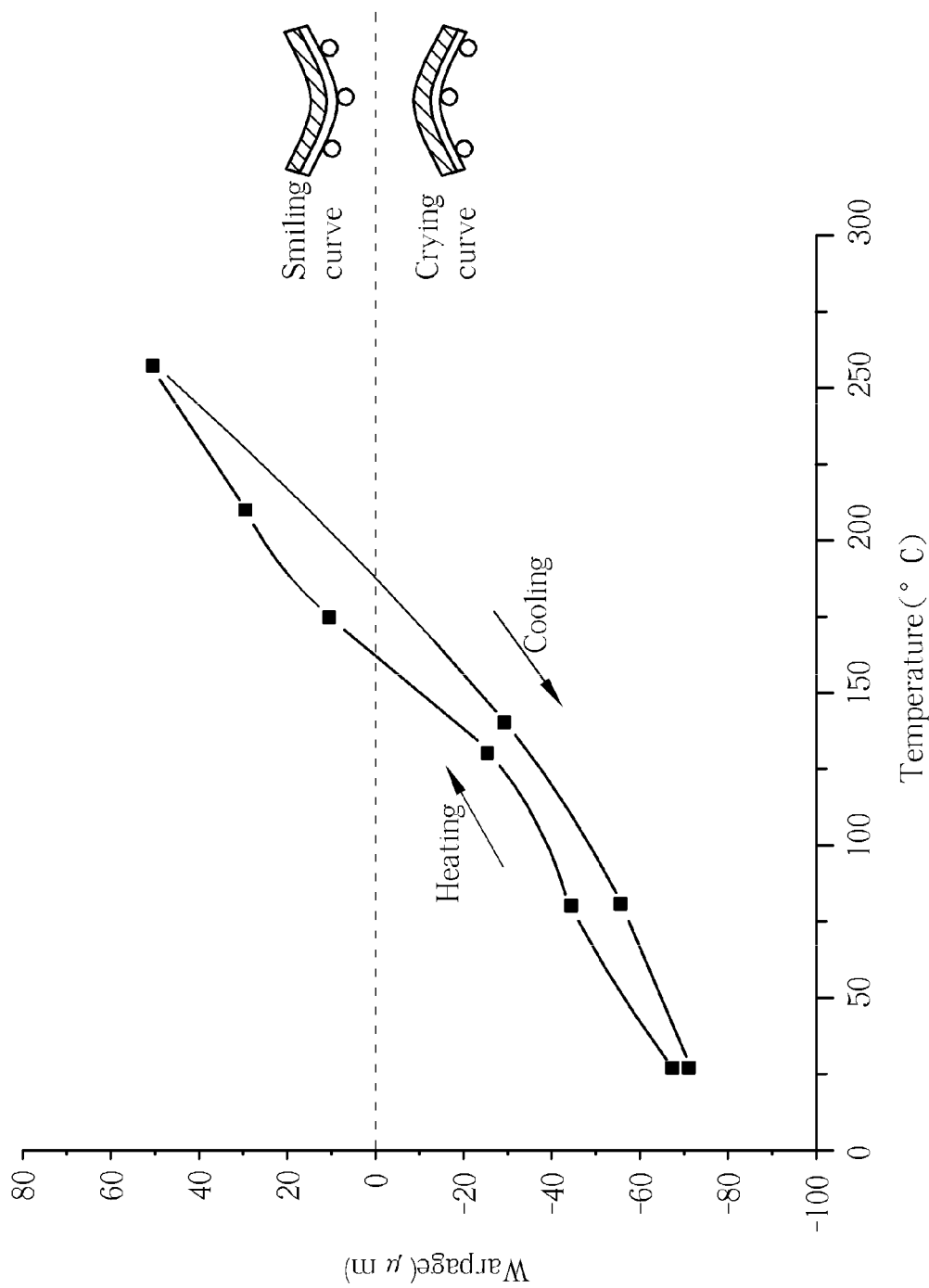
FIG. 1 is a schematic degree-of-warpage vs. temperature graph during a thermal cycle implemented in a conventional reliability testing process for a chip package.
Figure 2:
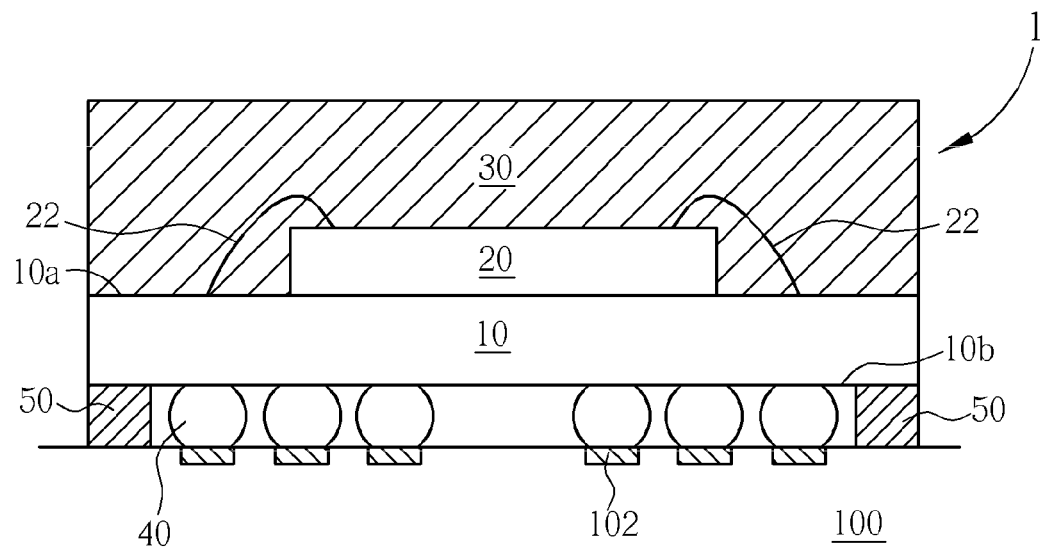
FIG. 2 is a schematic, cross-sectional diagram showing a semiconductor package structure when in a relatively low-temperature zone in accordance with one preferred embodiment of this invention.
Figure 3:
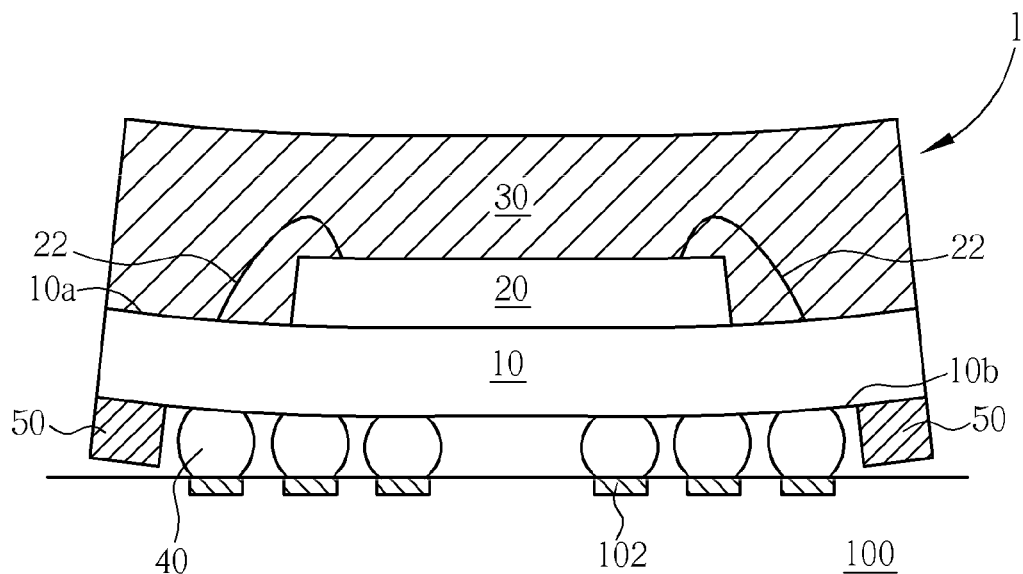
FIG. 3 is a schematic, cross-sectional diagram showing a semiconductor package structure when in a relatively high-temperature zone according to this invention.

Please refer to FIG. 2 and FIG. 3. FIG. 2 is a schematic, cross-sectional diagram showing a semiconductor package structure when in a relatively low-temperature zone in accordance with one preferred embodiment of this invention. FIG. 3 is a schematic, cross-sectional diagram showing a semiconductor package structure when in a relatively high-temperature zone.

As shown in FIG. 2, the semiconductor package structure 1 comprises a carrier substrate 10. On a top surface 10a of the carrier substrate 10, there is provided an integrated circuit (IC) die 20. The IC die 20 is electrically connected with the carrier substrate 10 through a plurality of bone wires 22. The top surface 10a of the carrier substrate 10 and the IC die 20 are covered and encapsulated by a molding compound 30. On a bottom surface 10b of the carrier substrate 10, a plurality of solder balls 40 are provided. The plurality of solder balls 40 are bonded to respective bond pads 102 on a printed circuit board (PCB) 100 thereby electrically connecting the carrier substrate 10 with the PCB 100.

It is one kernel feature of this invention that at least one protection bar 50 is disposed on the bottom surface 10b of the carrier substrate 10 and the protection bar 50 is made of thermosetting polymeric materials, for example, CEL-1802-HF19-GZ, CEL-1802-HF19-GB, CEL-1802-HF19-GC, CEL-1802-HF19-GF, CEL-1802-HF19-GJ or CEL-1802-HF19-HA, which are all product names of Hitachi Chemical Co., Ltd. According to the preferred embodiment of this invention, the protection bar 50 and the molding compound are made of the same polymeric material, preferably, CEL-1802-HF19-GF, CEL-1802-HF19-GJ or CEL-1802-HF19-HA available from Hitachi Chemical Co., Ltd.

As shown in FIG. 2, in accordance with the preferred embodiment, when the semiconductor package structure 1 is in a relatively lower temperature zone, for example, a relatively lower temperature zone ranging between 25° C. and 125° C., the warping force of the semiconductor package structure 1 is bridled because the rigid protection bar 50 shores up the warping edges of the semiconductor package structure 1. The warping force of the semiconductor package structure 1 is counteracted when the protection bar 50 leans against the top surface of the PCB 100 and obtains mechanical support from the PCB 100. Such configuration makes the semiconductor package structure 1 keep its shape at low temperatures and prevents the solder joints from damage due to compressive stress.

As shown in FIG. 3, when the semiconductor package structure 1 is in a relatively higher temperature zone, for example, a relatively higher temperature zone ranging between 125° C. and 280° C., the heat and the mismatch of CTE warps the edges of the semiconductor package structure 1 and the side view of the semiconductor package structure 1 is analogous to a smiling curve. However, the protection bar 50 made of thermosetting polymeric materials can counteract part of the warping force and decrease the tensile stress exerted on the solder balls 40. Since the protection bar 50 is rigid and is disposed along the periphery of the bottom surface 10b of the carrier substrate 10, the upwardly warping of the semiconductor package structure 1 can be counteracted.

It is another kernel feature of this invention that the materials for the molding compound 30 is specially chosen in order to keep the deformation of the semiconductor package structure 1 be maintained only in a crying curve through the thermal cycle of the reliability testing. It means that the edges of the semiconductor package structure 1 only warp downwardly throughout the span of the thermal cycle of the reliability testing.

Figure 4:
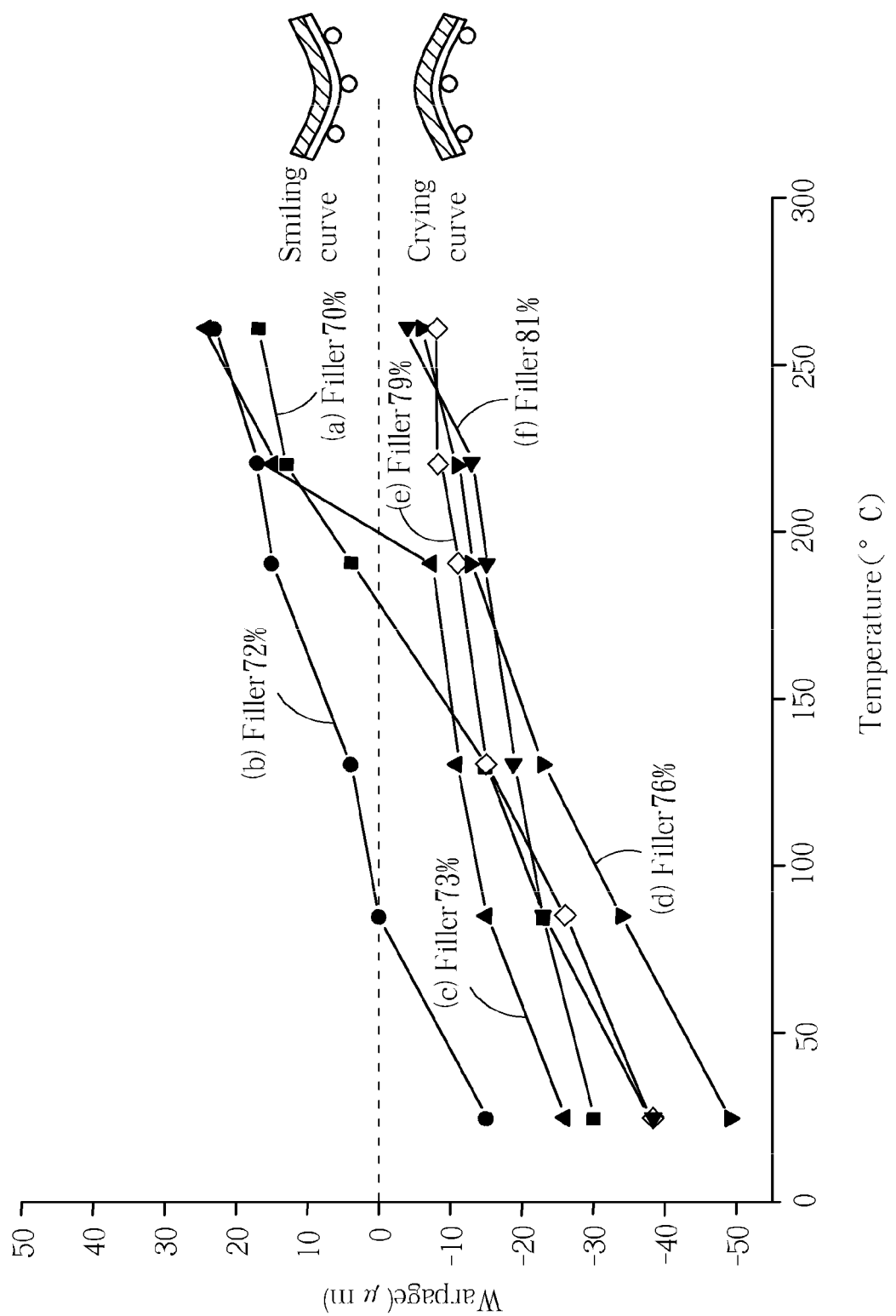
FIG. 4 is a warpage vs. temperature graph regarding molding compounds made of different recipes of silicon dioxide filler according to this invention.

Please refer to FIG. 4. FIG. 4 is a warpage vs. temperature graph regarding molding compounds made of different recipes of silicon dioxide filler. As shown in FIG. 4, the curves (a)-(f) represent molding compounds made of thermosetting polymeric materials comprising different percentage of silicon dioxide filler. For example, the curves (a)-(f) correspond to CEL-1802-HF19-GZ (percentage of silicon dioxide filler: 70%), CEL-1802-HF19-GB (percentage of silicon dioxide filler: 72%), CEL-1802-HF19-GC (percentage of silicon dioxide filler: 73%), CEL-1802-HF19-GF (percentage of silicon dioxide filler: 76%), CEL-1802-HF19-GJ (percentage of silicon dioxide filler: 79%), and CEL-1802-HF19-HA (percentage of silicon dioxide filler: 81%), which are available from Hitachi Chemical Co., Ltd.

According to the preferred embodiment, the curves (d), curve (e) and curve (f) and the corresponding CEL-1802-HF19-GF (silicon dioxide filler: 76%), CEL-1802-HF19-GJ (silicon dioxide filler: 79%), and CEL-1802-HF19-HA (silicon dioxide filler: 81%) are preferred thermosetting polymeric materials for the molding compound 30 because they keep the deformation of the semiconductor package structure 1 be maintained only in a crying curve through the thermal cycle of the reliability testing.

Figure 5:
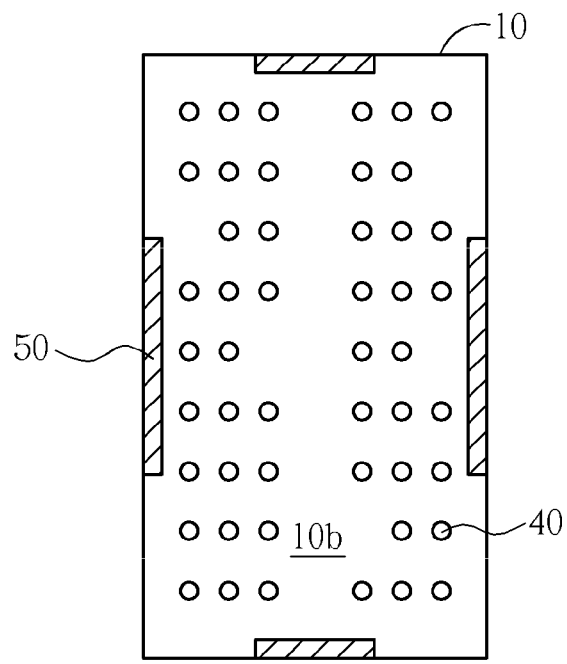
FIG. 5 and FIG. 6 are schematic diagrams illustrating the exemplary layouts of the protection bar of the semiconductor package structure when viewed from the bottom surface of the carrier substrate according to this invention.
Figure 6:
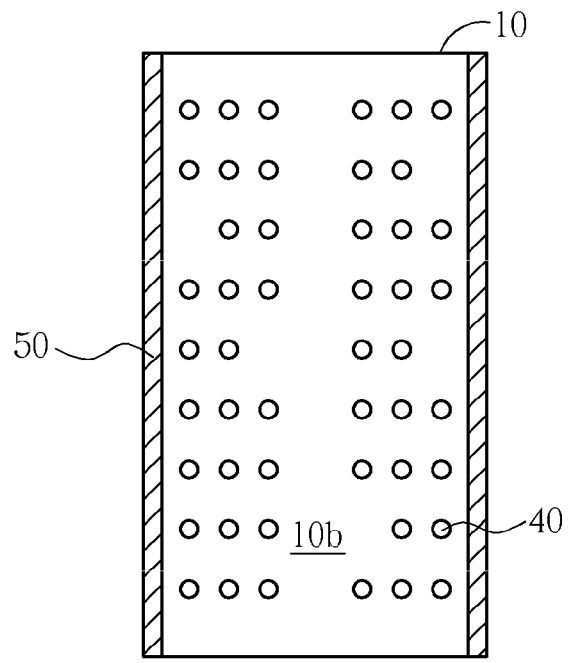

Please refer to FIG. 5 and FIG. 6. FIG. 5 and FIG. 6 are schematic diagrams illustrating the exemplary layouts of the protection bar 50 of the semiconductor package structure 1 when viewed from the bottom surface 10b of the carrier substrate 10. As shown in FIG. 5, the protection bar 50 may be disposed along the peripheral edges of the bottom surface 10b of the carrier substrate 10. Alternatively, the protection bar 50 may be disposed along the two opposite peripheral edges of the bottom surface 10b of the carrier substrate 10, as shown in FIG. 6. One advantage of the present invention is that since the protection bar 50 is made of thermosetting polymeric materials and is relatively rigid the ability of the semiconductor package structure 1 in passing the edge break testing is improved.

Figure 7:
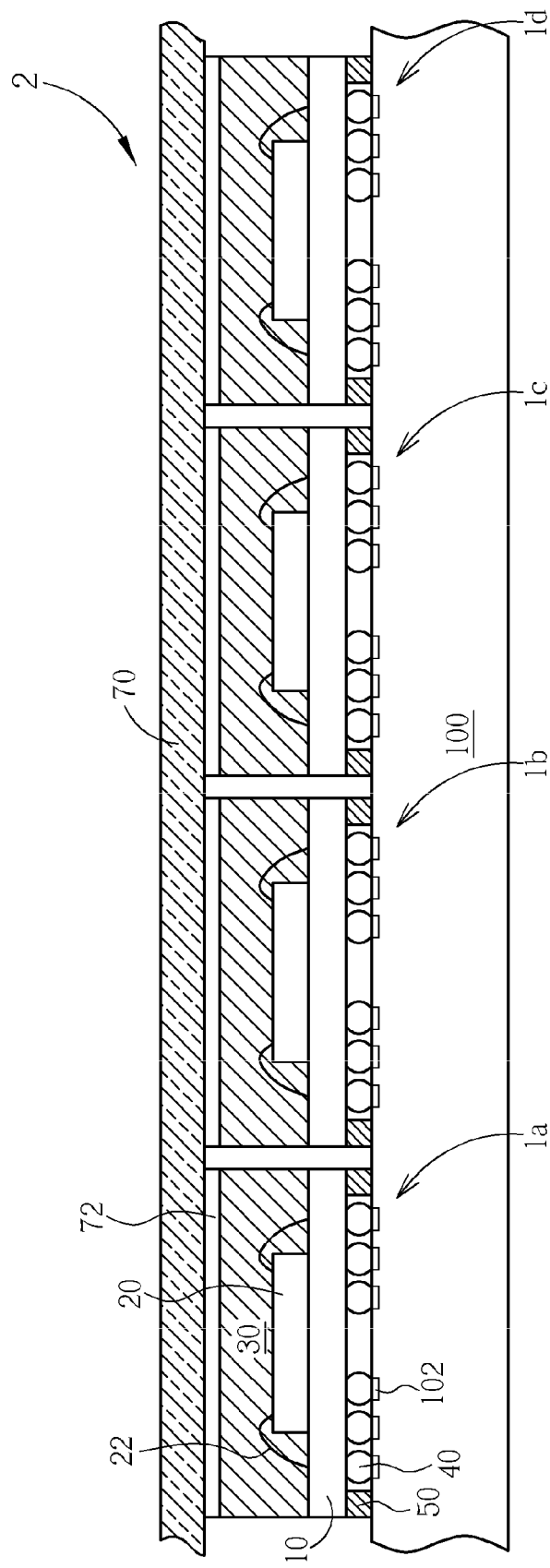
FIG. 7 is a schematic, cross-sectional diagram showing a memory module structure in accordance with another preferred embodiment of this invention.

Please refer to FIG. 7. FIG. 7 is a schematic, cross-sectional diagram showing a memory module structure in accordance with another preferred embodiment of this invention. As shown in FIG. 7, in accordance with this embodiment, a memory module structure 2 is provided. The memory module structure 2 comprises a PCB 100, a plurality of memory chip packages 1a, 1b, 1c and 1d mounted on the PCB 100, and a monolithic heat sink lid 70 covering and contacting the plurality of memory chip packages 1a, 1b, 1c and 1d. A heat-dissipating glue is provided between the memory chip package 1a and the heat sink lid 70, between the memory chip package 1b and the heat sink lid 70, between the memory chip package 1c and the heat sink lid 70, and between the memory chip package 1d and the heat sink lid 70.

According to this preferred embodiment, each of the memory chip packages 1a, 1b, 1c and 1d has the same structure as the semiconductor package structure 1 depicted in FIG. 2 and includes a carrier substrate 10, an IC die 20 on a top surface 10a of the carrier substrate 10, bond wires 22 electrically connecting the IC die 20 with the carrier substrate 10, and a molding compound 30 covering the top surface 10a of the carrier substrate 10 and encapsulating the IC die 20. Likewise, a plurality of solder balls 40 are implanted on the bottom surface 10b of the carrier substrate 10 to electrically connect to the bond pads 102 on the PCB 100. On the bottom surface 10b of the carrier substrate 10, there is provided a protection bar 50 that is made of thermosetting polymeric materials. According to this embodiment of this invention, the protection bar 50 and the molding compound 30 are made of the same polymeric materials, preferably, CEL-1802-HF19-GF, CEL-1802-HF19-GJ or CEL-1802-HF19-HA available from Hitachi Chemical Co., Ltd.

The protection bars 50 of the memory chip packages 1a, 1b, 1c and 1d act as a spacer between the carrier substrate 10 and the PCB 100, which improve the planarity control of the top surfaces of the memory chip packages 1a, 1b, 1c and 1d. The protection bars 50 can make sure that the top surfaces of the memory chip packages 1a, 1b, 1c and 1d are flush with each other and the planarity is not affected by the variation of the size of the solder balls 40. The improved planarity control increases the reliability when assembling the heat sink lid 70 and the protection bars 50 can make sure that the heat sink lid 70 contact with each top surface of the memory chip packages 1a, 1b, 1c and 1d.

Those skilled in the art will readily observe that numerous modifications and alterations of the device and method may be made while retaining the teachings of the invention.

What is claimed is:

1. A semiconductor package structure, comprising:
a carrier substrate;

an integrated circuit die mounted on a top surface of the carrier substrate;
a molding compound covering and encapsulating the top surface and the integrated circuit die;
a plurality of solder balls mounted on a bottom surface of the carrier substrate; and
at least one protection bar disposed on the bottom surface of the carrier substrate, wherein the molding compound and the protection bar are made of the same thermosetting polymeric material such that edges of the semiconductor package structure only warp downwardly throughout span of thermal cycle of a reliability testing.

2. The semiconductor package structure according to claim 1 wherein the protection bar is disposed along a peripheral edge of the bottom surface of the carrier substrate.

3. The semiconductor package structure according to claim 1 wherein the integrated circuit die is electrically connected with the carrier substrate through a plurality of bond wires.

* * * * *